United States Patent
Yi et al.

(10) Patent No.: US 9,520,299 B2
(45) Date of Patent: Dec. 13, 2016

(54) ETCH BIAS CONTROL

(71) Applicant: GLOBALFOUNDRIES Singapore Pte. Ltd., Singapore (SG)

(72) Inventors: Wanbing Yi, Singapore (SG); Chin Chuan Neo, Singapore (SG); Hai Cong, Singapore (SG); Kin Wai Tang, Singapore (SG); Weining Li, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/981,881

(22) Filed: Dec. 28, 2015

(65) Prior Publication Data
US 2016/0189971 A1     Jun. 30, 2016

(51) Int. Cl.
| | |
|---|---|
| *H01L 21/308* | (2006.01) |
| *H01L 21/027* | (2006.01) |
| *G03F 1/00* | (2012.01) |
| *G03F 1/36* | (2012.01) |
| *H01L 21/033* | (2006.01) |

(52) U.S. Cl.
CPC ........ *H01L 21/3088* (2013.01); *H01L 21/0274* (2013.01); *H01L 21/3081* (2013.01); *G03F 1/00* (2013.01); *G03F 1/144* (2013.01); *G03F 1/36* (2013.01); *H01L 21/0337* (2013.01)

(58) Field of Classification Search
CPC ............. H01L 27/11526; H01L 21/308; H01L 21/31144; H01L 21/0274; H01L 21/0337; H01L 21/28123; H01L 21/3088; G03F 1/00; G03F 1/144; G03F 1/36
USPC ......................................................... 438/735
See application file for complete search history.

(56) References Cited

U.S. PATENT DOCUMENTS

| | | | |
|---|---|---|---|
| 5,763,143 | A | 6/1998 | Sakura |
| 6,165,692 | A | 12/2000 | Kanai et al. |
| 6,262,435 | B1 | 7/2001 | Plat et al. |
| 6,458,606 | B2 | 10/2002 | Plat et al. |
| 6,566,017 | B1 | 5/2003 | Chen et al. |
| 7,305,651 | B2 | 12/2007 | Cao |
| 8,105,757 | B2 | 1/2012 | Choi |
| 2002/0116686 | A1 | 8/2002 | Shin et al. |
| 2006/0097399 | A1 | 5/2006 | Hatano et al. |
| 2008/0241734 | A1 | 10/2008 | Liu et al. |
| 2011/0086512 | A1 | 4/2011 | Hashimoto et al. |
| 2012/0171865 | A1 | 7/2012 | Yoo |
| 2014/0285789 | A1 | 9/2014 | Lu et al. |

OTHER PUBLICATIONS

Written Opinion of Singapore Patent Application 10201408775S mailed on Nov. 12, 2015.

*Primary Examiner* — Caleen Sullivan
(74) *Attorney, Agent, or Firm* — Horizon IP Pte. Ltd.

(57) ABSTRACT

A semiconductor device and method for forming a semiconductor device are presented. The method includes providing a patterned reticle having a pattern perimeter defined by active and dummy patterns. The dummy patterns include dummy structures modified according to a density equation. The patterned reticle is used to pattern a resist layer on a substrate with a device layer. An etch is performed to pattern the device layer using the patterned resist layer. Additional processing is performed to complete formation of the device.

26 Claims, 8 Drawing Sheets

ETCH BIAS CONTROL

CROSS-REFERENCE TO RELATED APPLICATION

This application claims priority to Singapore Patent Application No. 102014087755, filed on Dec. 29, 2014, which is herein incorporated by reference in its entirety for all purposes.

BACKGROUND

Basic lithography process typically transfers a desired pattern from a patterned mask to the semiconductor wafer to form one or more semiconductor devices. The lithography process include an etch step, where the desired pattern is selectively etched onto the wafer. Additional etching processes may also continue to pattern the wafer or device as desired. Ideally, an etched pattern would align precisely with the etch mask to produce a zero-bias etching process. In reality, varying differences between etched patterns and mask patterns is usually present to produce a large range of etch bias. The magnitude of etch bias variation may undermine the uniformity of identical structures formed across a wafer.

There is, therefore, a need to control etch bias to achieve an optimum process window.

SUMMARY

Embodiments generally relate to semiconductor device and method of forming a semiconductor device. In one embodiment, a method of forming a device is disclosed. A patterned reticle having a pattern perimeter defined by active and dummy patterns may be provided. The dummy patterns include modified dummy structures. The dummy structures may be modified according to a density equation. A resist layer is formed on a substrate with a device layer. The resist layer is exposed and developed using the reticle to form a patterned resist layer containing active and dummy patterns of the reticle. An etch may use the patterned resist layer to pattern the device layer. Additional processing is performed to complete formation of the device.

In another embodiment, a method of forming a device is disclosed. The method includes providing a patterned reticle having a pattern perimeter or density defined by active and dummy patterns. The active patterns are disposed in a device region and the dummy patterns are disposed in device and frame regions. The dummy patterns may include modified dummy structures which are modified according to a density equation. A resist formed on a substrate with a device layer may be patterned using the reticle to form a resist layer containing active and dummy patterns of the reticle. An etch may use the patterned resist layer to pattern the device layer and additional processing may complete the device.

In yet another embodiment, a device is disclosed. The device includes a patterned mask having a pattern perimeter defined by active and dummy patterns. The active patterns may be disposed in a device region and the dummy patterns may be disposed in the device and frame regions. The frame region surrounds the device region while the pattern perimeter may correlate to an etch bias. The dummy patterns may include modified dummy structures defined by a density equation while the modified dummy structures may define a pattern perimeter value.

In another embodiment, a method for forming a device is disclosed. The method includes providing a patterned reticle having a reticle perimeter with a main reticle region and a perimeter reticle region. The reticle perimeter includes a desired pattern density to produce a desired etch bias (Ebias). A resist layer is formed on a substrate with a device layer. The resist layer is exposed and developed using the reticle to form a patterned resist layer containing active and dummy patterns of the reticle. A etch is performed to pattern the device layer using the patterned resist layer and additional processing is performed to complete forming the device.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following.

DETAILED DESCRIPTION

Embodiments generally relate to devices, for example, semiconductor devices or integrated circuits (ICs). More particularly, embodiments relate to dummy patterns in ICs. The ICs can be any type of IC, such as dynamic or static random access memories, signal processors, microcontrollers or system-on-chip (SoC) devices. Other types of devices may also be useful. The devices or ICs can be incorporated into or used with, for example, consumer electronic products, or other types of products.

Figure 1:
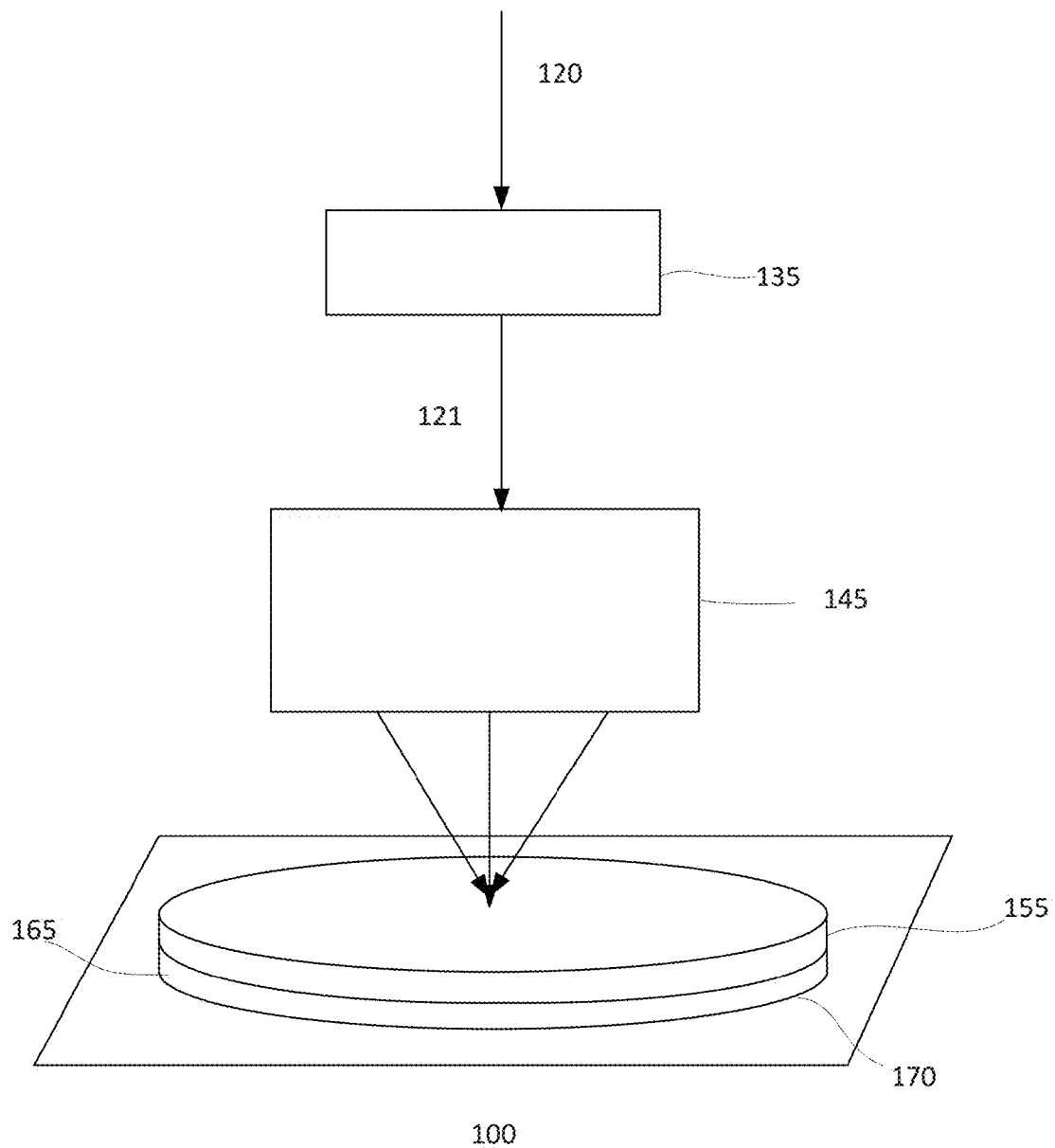
FIG. 1 shows a simplified diagram of a portion of an exemplary lithographic system.

FIG. 1 shows a simplified portion of an exemplary photolithography system 100 used for patterni ng a wafer to form features, such as circuit components. The photolithography system 100 may include, exposure, beam shaping and illumination sub-systems (not shown). The exposure sub-system, for example, includes an exposure source for generating electromagnetic radiation (EMR). In one embodiment, the EMR is used in extreme ultra-violet (UN) lithography. The EMR is passed through the beam shaping sub-system, which may include a collimator and monochromator to prepare an EMR beam e.g., EMR operating beam). The EMR operating beam 120 is passed through the illumination sub-system. The illumination sub-system, for example, may include mirrors and/or lenses. The illumination sub-system conducts the EMR operating beam 120 to a mask or reticle 135 having a desired pattern (e.g., mask pattern).

In one embodiment, the reticle 135 is a transmissive reticle. For example, the reticle 135 transmits the EMR operating beam 120 through it. The transmitted EMR beam 121 is a patterned beam having the pattern of the reticle 135. Other types of reticles, such as reflective reticles, can also be employed. For example, the reflective reticle reflects the EMR operating beam 120, creating a reflected patterned beam. In one embodiment, the perimeter and transmission rate of the reticle 135 were observed to have strong correlations to etch bias.

The patterned beam 121 is projected onto a wafer 165. In one embodiment, the wafer 165 is disposed on a translation stage 170. In one embodiment, the patterned beam 121 is projected onto the wafer by a projection sub-system 145. The projection sub-system 145 may include mirrors and/or lenses for projecting the patterned beam 121 onto a portion of the wafer 165. The wafer includes a photoresist or resist layer 155 which is exposed by the patterned beam 121. For example, the image of the patterned beam 121 is imaged onto the photoresist layer 155. The patterned beam 121 exposes a portion of the wafer 165 with the image of the reticle 135. The exposed portion corresponds to a device region on which a device is formed. After exposing the portion, the stage 170 may be translated to expose a next portion of the wafer 165. The exposure process repeats until the complete wafer 165 is exposed. Processing a wafer 165 using other types of lithographic or printing systems may also be useful.

After the wafer 165 has been exposed, the photoresist 155 is developed, transferring the pattern of the reticle 135 to the resist layer 155. An anti-reflective coating (ARC) may be provided beneath the resist layer 155 to improve lithographic resolution. The patterned resist layer 155 serves as an etch mask. For example, an anisotropic etch, such as a reactive ion etch (RIE), patterns the wafer 165 using the etch mask. Depending on the stage of process, the etch process may etch a bare wafer, a layer on the wafer, or multiple layers on the wafer 165. In the fabrication of an IC, numerous patterning processes utilizing different reticles may be performed.

After processing of the wafer 165 is completed, the wafer 165 is diced along the dicing channel (or kerf) to produce individual dies or ICs. The dies are packaged to form chips. In some embodiments, wafer level packaging may be performed prior to dicing the wafer. Other configurations of packaging the ICs may also be useful.

Figure 2:
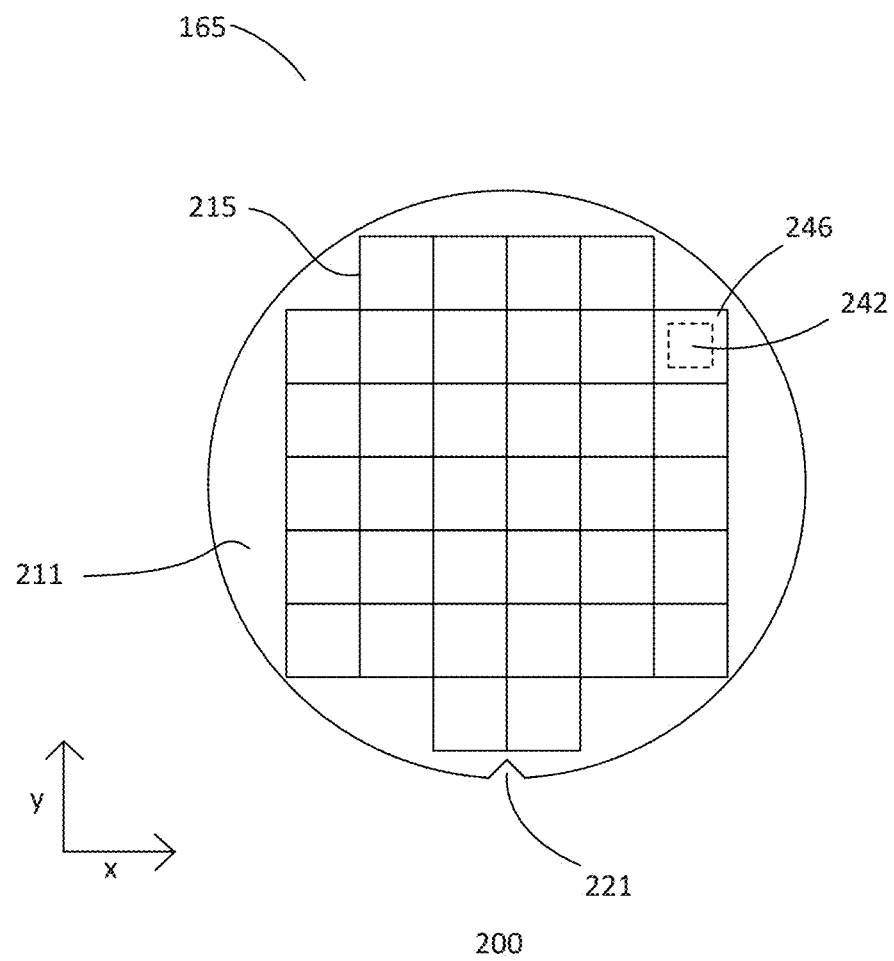
FIG. 2 shows a simplified plan view of a semiconductor water.

FIG. 2 shows a simplified plan view of an embodiment 200 of a semiconductor wafer 165. The semiconductor wafer 165, for example, may be a silicon wafer. Other types of wafers are also useful. For example, the wafer 165 may be a p-type, n-type, silicon-on-insulator (SOI) or silicon germanium wafer. The wafer 165 may include a notch 221 to indicate the crystal orientation of the wafer 165. Other techniques for indicating the crystal orientation may also be useful. Additional indicators may also be included to indicate the dopant type of the wafer.

The wafer includes an active surface 211 on which devices 215 are formed. A plurality of devices 215 may be formed on the wafer in parallel. The devices 215, for example, are arranged in rows along a first (x) direction and columns along a second (y) direction. A device includes a main device region 242 and a frame region 246. The main device region 242 includes features and interconnections of the device. As for the frame region 246, it surrounds the main device region 242. The frame region 246, for example, serve as dicing channels on the wafer 165, separating adjacent devices. The devices 215 are singulated by dicing the wafer along the dicing channels.

Figure 3:
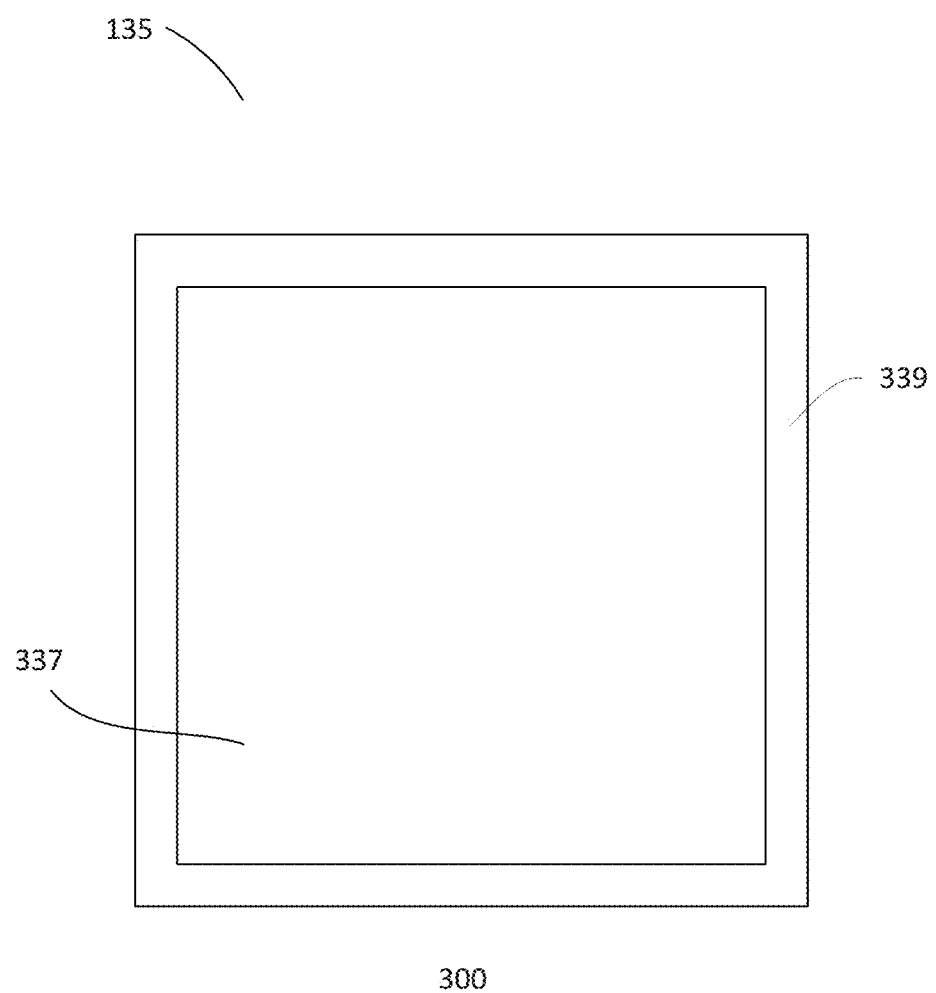
FIG. 3 shows an embodiment of a reticle used in exposing a wafer.

FIG. 3 shows an embodiment 300 of a reticle 135 used in exposing a wafer 165. The reticle 135 is, for example, a transmissive reticle. Other types of reticles may also be useful. As shown, the reticle 135 includes a prime or main region 337. The main region 337, for example, may be referred to as the device region. The main region 337 includes a pattern which, for example, corresponds to the pattern be formed in the device. The main region 337 creates patterns of devices 215 in the main device regions 242 on the wafer 165. A frame region 339 surrounds the main region 337. The frame region 339, for example, corresponds to dicing channels 246 on the wafer 165. The frame region surrounds the device regions on the wafer. Dummy patterns may be provided in both the frame and main regions. In addition, test patterns may be provided in the frame region. Other configurations of the main and frame regions may also be useful. The reticle 135 is used to create desired patterns for respective levels on the device. In forming the device, numerous reticles may be employed.

As shown, a reticle includes a rectangular shape having width W and length L. The total area of the reticle is defined as W×L. The total area, for example, includes the area of the main and frame regions. For example, W is the total width and L is the total length of the reticle. Reticles of a mask set have the same sized reticles (e.g., same sized reticle area). Mask sets for different devices may have different sized reticles. For example, different devices may employ different sized reticles, which have different reticle area.

As discussed, a wafer 165 is patterned by RIE using an etch mask, such as a photoresist mask. The pattern of the etch mask has a critical dimension (CD) from lithographic exposure and development. The CD of the etch mask may be referred to as developed CD (DCD). The pattern of the etched wafer has a patterned or final CD (FCD). An etch bias (Ebias) can be defined as the difference between DCD and FCD, as illustrated by the following equation:

$$Ebias = DCD - FCD$$

The FCD may be smaller (positive Ebias), equal (neutral Ebias) or larger (negative Ebias) than DCD. Ebias also has been found to have a strong correlation with the reticle perimeter. This correlation has been observed with, for example, advanced technology nodes, such as 40 nm and below. The reticle perimeter is defined as the total length of the layout features within the reticle. This includes features in the frame and the main regions of the reticle. For example, this includes the total length of features or structures, such as device features, dummy features and test features in the frame and main regions. Total length of features refers to the total length or the circumference length and width) of the polygon of all features within the reticle. As such, the reticle perimeter is equal to the total length of the circumference of all features within the reticle, including the frame and main regions. For example, the reticle perimeter is equal the total length of the circumference of all opaque features within the reticle, including the frame and main regions.

Figure 4:
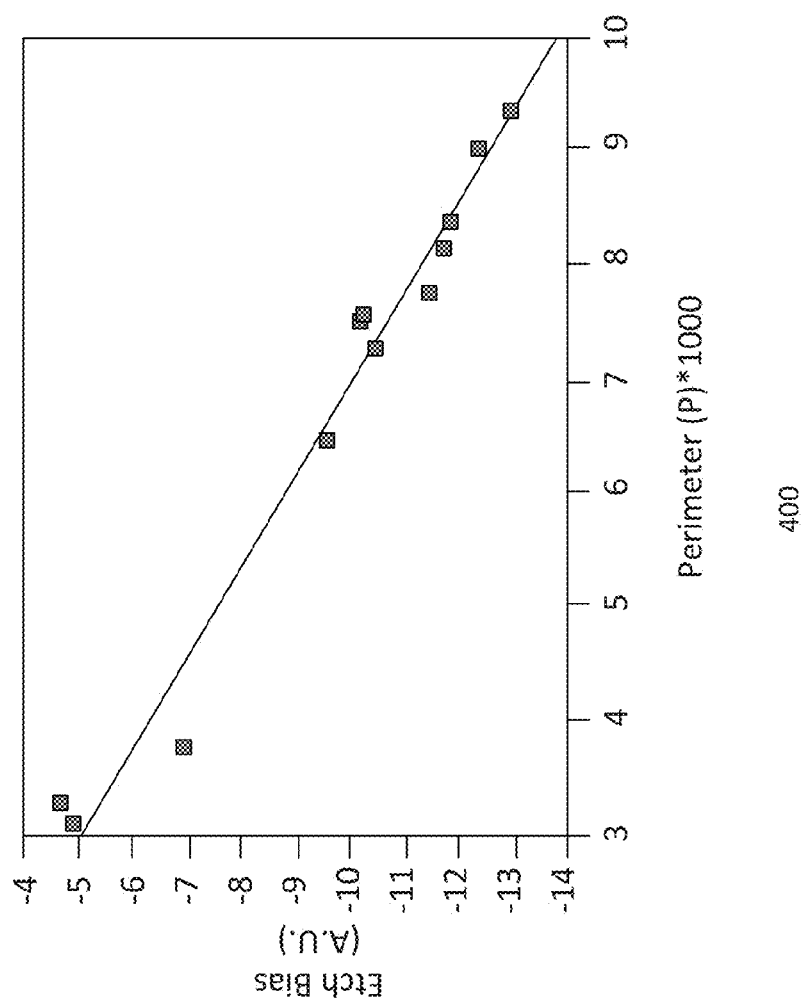
FIG. 4 shows a graph plotting of Ebias with respect to reticle perimeter.

FIG. 4 shows a graph 400 plotting of Ebias with respect to reticle perimeter for a given etch process. The vertical axis denotes Ebias in arbitrary unit (A.U.) while the horizontal axis denotes reticle perimeter. The graph plots Ebias with respect to reticle perimeter for the first metal layer (M1) of a device. Although the plot is based on M1, the correlation is applicable to other mask levels. For example, the correlation is observed in other metal levels as well as non-metal levels, such as the gate level. The graph 400 shows a strong Ebias correlation with the reticle perimeter or total length of patterns within the reticle. The values of reticle perimeter, for example, are normalized values. The magnitude of Ebias increases as the reticle perimeter increases. This correlation can be determined for different etch processes.

Ebias also has a strong correlation with the transmission rate (RT) of the reticle. For example, Ebias correlates with the RT of a reticle during lithographic exposure. The RT of a reticle depends on the density of the reticle, including the main and frame regions. For example, the RT of a reticle depends on the density of opaque patterns of the reticle, including the main and frame regions. In the case where positive resist is used, a higher RT correlates to a higher pattern density. If negative resist is used, a higher RT correlates to a lower pattern density.

Figure 5:
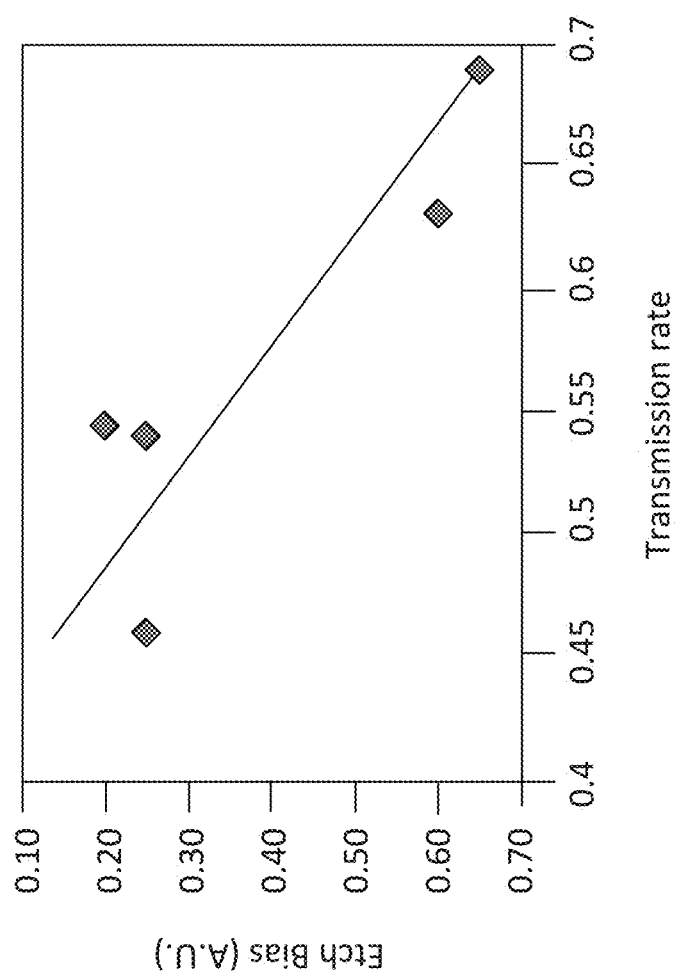
FIG. 5 shows a graph plotting of Ebias with respect to transmission rate (RT) of a reticle.

FIG. 5 shows a graph 500 plotting Ebias with respect to RT of a reticle 135 for a given etch process. The vertical axis denotes Ebias in arbitrary unit (A.U.) while the horizontal axis denotes transmission rate of a reticle. The graph plots Ebias with respect to RT of the reticle for the FA layer, which is a metal layer of a device. The FA is, for example, a metal layer with larger dimensions than M1. Although the plot is for FA, the correlation is applicable to other mask levels. For example, the correlation is observed in other metal levels as well as non-metal levels, such as the gate level. From the graph, it is clear that there is a strong Ebias correlation with RT of a reticle 135. The magnitude of Ebias increases, for example, relative to an increase in RT and vice-versa.

In one embodiment, dummy patterns are provided in the reticle to achieve the desired or target Ebias. For example, dummy patterns are provided in the reticle to achieve the target Ebias. This can be achieved by providing dummy patterns with a corresponding RT or reticle perimeter to the target Ebias. For example, a target Ebias can be achieved with a corresponding target RT. In one embodiment, dummy patterns are provided in the main and frame regions of the reticle 135.

Since RT is related to pattern density, the dummy patterns may be provided which result in a pattern density in the reticle to achieve the target RT. For example, the pattern density of all patterns in the main and frame regions of a reticle may be selected to achieve the target RT. In one embodiment, the reticle is tailored with a target P to achieve a target RT, which results in a target Ebias. In other embodiments, the reticle may be tailored with a target P to achieve a target reticle perimeter, which results in a target Ebias. However, the curve used to determine the target P for reticle perimeter is different than the curve used to determine the target P for transmission rate.

The density of overall patterns in the reticle (P) is as follows:

$$P = P_{MainFeature} + P_{Dummy}$$

where,

P is the total density of patterns of the reticle,
$P_{MainFeature}$ is the density of device patterns in the main reticle region 337, and
$P_{Dummy}$ is the density of dummy patterns in the main 337 and frame regions 339.

The $P_{MainFeature}$ is fixed while $P_{Dummy}$ is a variable. For example, for a given $P_{MainFeature}$, the $P_{Dummy}$ can be adjusted to define P as desired. The $P_{MainFeature}$ is, for example, the pattern of features which form the device. The $P_{Dummy}$ is, for example, dummy patterns which are designed to tailor P to a desired value. For example, P is tailored to achieve the target RT.

In one embodiment, the $P_{Dummy}$ is configured to produce a desired or target P, resulting in a desired or target Ebias. For example, the target Ebias can be achieved by tailoring $P_{Dummy}$ accordingly to produce the target P. As such, a reticle can be designed to produce a target Ebias. For example, a reticle can be designed to have an Ebias or a narrow range of Ebias. The narrow range of Ebias, for example, may be about +/−5% of the target. Other Ebias ranges may also be useful.

As described, different etch processes may have their respective E-bias curves. Reticles of a mask set utilizing the same etch process may be designed with the same Ebias based on P. For reticles utilizing different etch processes, they may be designed with respective Ebias based on P. Reticles of different etch processes may be designed with the same or different Ebias. Furthermore, this can be extended across reticles of different devices. By controlling Ebias, within a device as well as across devices, production of device or devices can be simplified, reducing costs.

Figure 6A:
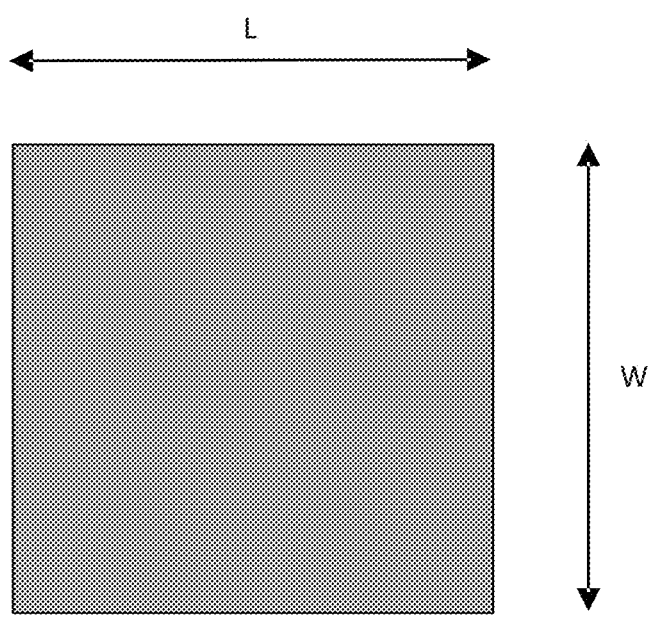
FIGS. 6a-6c show embodiments of a dummy structure.
Figure 6B:
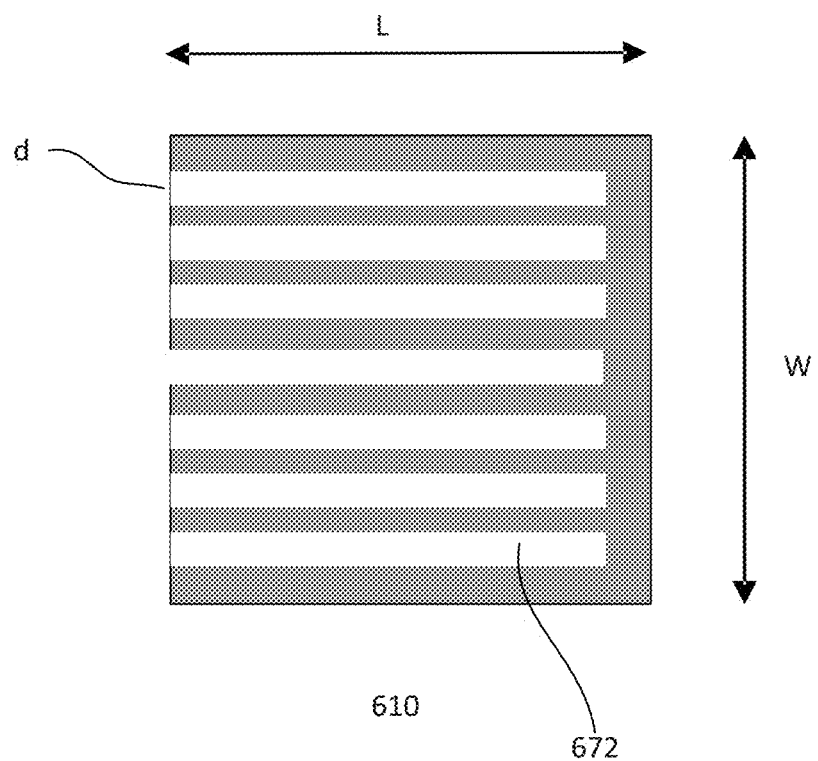
Figure 6C:
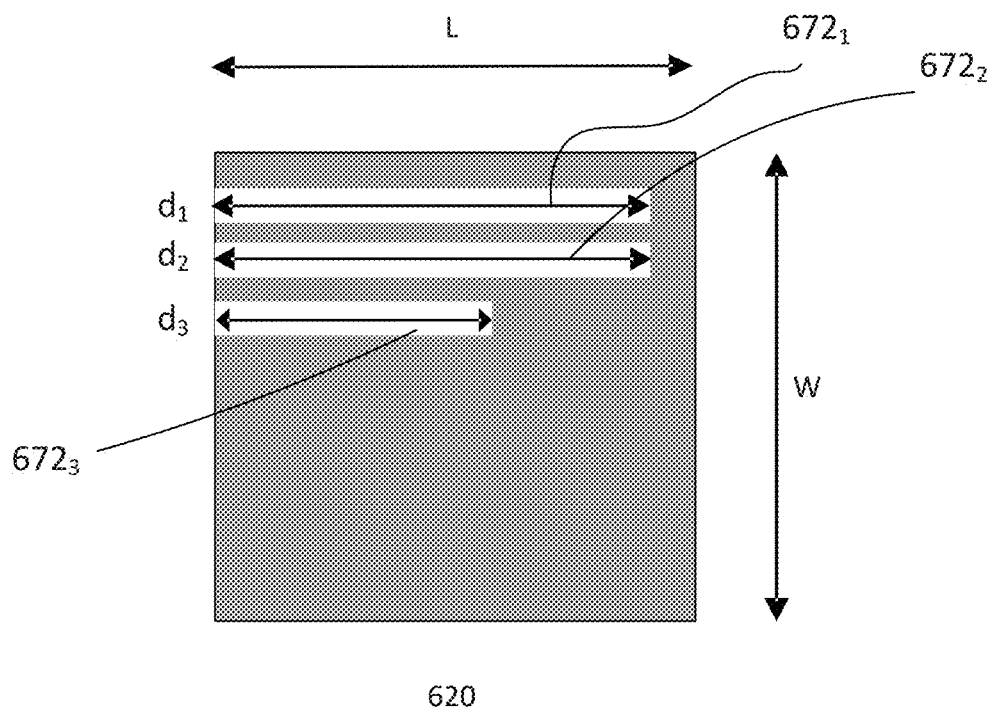

FIGS. 6a-6c show embodiments of a dummy structure. Referring to FIG. 6a, the dummy structure may be a solid dummy structure 600. The dummy structure 600 may be disposed in any empty area in the reticle 135. In one embodiment, a plurality of dummy structures 600 may be disposed in the main and frame regions of the reticle 135. The dummy structures are tailored to produce a reticle with a target pattern density. For example, the dummy structures are tailored to produce a reticle with a target Ebias. The target Ebias may result from a reticle with a target reticle perimeter or target RT.

Depending on the level, the dummy structures may be conductive materials, such as tungsten or copper. For example, the dummy structure may be the material used to form contacts in the contact (CA) or via level or copper in metal levels. Other types of materials, such as polysilicon, may also be useful. For example, polysilicon may be used for the gate level. Other mask levels of the mask set may also be applicable.

The dummy structures 600, as shown, are rectangular in shape having a width W and length L. In one embodiment, the dummy structures 600 are square shaped structures, where W=L. For a solid dummy structure 600, the total area occupied by it is determined by its dimensions. For example, in the case of a rectangular solid dummy structure 600, the area of the dummy structure is equals to W×L. As for the circumference of the dummy structure, it is equals to 2 W+2L. For dummy structures having another geometric shape, the area and circumference is determined by the area and circumference formula for that geometric shape.

FIG. 6b shows another embodiment of a dummy structure. The dummy structure may be similar to that described in FIG. 6a. Common elements may not be described or described in detail. As shown, the dummy structure is a non-solid dummy structure 610. For example, the dummy structure 610 may be a conductive structure, such as copper formed in a dielectric layer. The non-solid dummy structure 610 may include one or more voids 672. Depending on the mask level, the voids 672 may be filled with dielectric material of the dielectric layer. Filling the voids with other types of materials may also be useful. The voids 672 may be completely within or partially within the dummy structure 610. For example, the dummy structure 610 may have a general geometric shape such as a rectangular shape having W and L. The voids 672 may be completely within the circumference of the dummy structure 610 or have an edge extending to the circumference of the dummy structure 610. Other configurations of voids 672 may also be useful.

The void or voids 672, as described, occupy a portion of the total area of the dummy structure 610. The total area occupied by the dummy structure 610 is equal to the area of the dummy structure 610 based on its geometric shape minus the total area occupied by the void or voids 672. For example, in the case of a rectangular shaped non-solid dummy structure 610, the total area is equal to area of the geometric shape of the dummy structure 610, which is W×L, minus the total area of the void or voids 672. As for dummy structures having another geometric shape, the area is determined by the formula of that geometric shape. Similar to the dummy structure 610, the area occupied by a void may be based on its dimension and geometric shape. The density of dummy structures in a region is equal to the total area of all dummy structures (minus voids of the dummy structures) divided by the total area of the region.

As shown, the dummy structures include voids which are slots. The slots are rectangular shaped slots having a void defined by width Ws and length Ls. Other shaped voids may also be useful. In one embodiment, the slots are disposed partially within the dummy structure 610. For example, one side of the slots extends to a side of the dummy structure 610 while the other sides are disposed within the dummy structure 610. Providing slots which are disposed completely within the dummy structure 610 may also be useful. The slots shown are of the same size and distributed uniformly in the dummy structure 610. In the case shown, the total area occupied by a dummy structure 610 is equal to the dimension of the dummy structure (W×L) minus the total area of the voids, which is equal to the n (number of voids) times the dimension of a void (Ws×Ls). For example, in the case where the n voids have the same area d, the total area of the dummy structure 610 is W×L minus the sum of the areas d of the n slots or n×d. Providing other configuration of voids 672, such as non-uniform sized voids as well as not uniformly distributed in the dummy structure 610 may also be useful.

FIG. 6c shows yet another embodiment of a dummy structure. The dummy structure may be similar to that described in FIGS. 6a and 6b. Common elements may not be described or described in detail. As shown, the dummy structure is a non-solid dummy structure 620.

In one embodiment, the dummy structure is a hybrid non-solid dummy structure 620. For example, hybrid non-solid dummy structure 620 includes voids which are of different sizes and not uniformly distributed in the dummy structure 620. As shown, the dummy structure includes first, second and third slots $672_{1-3}$. The slots are rectangular shaped slots having areas $d_1$, $d_2$, and $d_3$, based on dimensions of the slot $672_{1-3}$. The slots $672_{1-3}$ are partially disposed within the dummy structure 620. For example, one side of the slot extends to a side of the dummy structure 620 while other sides are disposed within the dummy structure 620. The first and second slots $672_{1-2}$ are of the same size (area) while the third slot $672_3$ is smaller. For example, $d_1=d_2$ and $>d_3$. The length of the third slot $672_3$ is shorter than the length of the first and second slots $672_{1-2}$. Further, the slots $672_{1-3}$ are distributed in a portion of the dummy structure 620, such as within a half of the dummy structure 620. Other configurations of slots or voids in the dummy structure may also be useful. Similar to FIG. 6b, the total area occupied by a dummy structure 620 is equal to the dimension of the dummy structure 620 minus the total area of the voids $672_{1-3}$, which is equal to the sum of $d_1$, $d_2$ and $d_3$.

The following is a density equation for dummy structures ($P_{Dummy}$) which may be used:

$$P_{Dummy} = f\left(Area_{Total}, W_{Dummy}, L_{Dummy}, S_{Dummy}, \sum_{1}^{n} Area(d_n)\right)$$

where,
$Area_{Total}$ is the total area of the region,
$W_{Dummy}$ is the width (W) of the dummy structure,
$L_{Dummy}$ is the length (L) of the dummy structure,
$S_{Dummy}$ is the spacing (S) between dummy structures, and
$Area(d_n)$ is the area of slots $d_n$.

The density of dummy structures may be tailored by adjusting the W, L, S and Area ($d_n$) of the dummy structures. For example, the dummy structures are tailored to adjust the total pattern perimeter (or density) of the region to an expected value.

As described, the P of the reticle can be determined. By adjusting the P of the reticle with dummy structures to produce a target density, the target Ebias can be achieved. This enables reticles of a set of masks which utilizes the same etch process to be designed to have about the same Ebias or a narrow range of Ebias. This also can be extended to other devices. For example, reticles of other devices utilizing the same etch process may be designed to have the same Ebias or a narrow range of Ebias. By controlling Ebias, within a device as well as across devices, production of device or devices can be simplified, reducing costs.

Furthermore, the reticle perimeter of a reticle can be adjusted by providing dummy structures. This enables a reticle to be designed to have a target Ebias. For example, the reticle may have a target or narrow range of Ebias. This also can be extended to other devices. For example, reticles of other devices utilizing the same etch process may be designed to have the same Ebias or a narrow range of Ebias. By controlling Ebias, within a device as well as across devices, production of device or devices can be simplified, reducing costs.

Moreover, with the use of dummy structures as described in FIGS. 6b-6c, a wider range of P or reticle perimeter can be achieved. This adds flexibility in designing reticles with the same or about the same Ebias. For example, the dummy structures engineered with slots increases flexibility in achieving the same or narrow range of Ebias within and across devices within a technology node.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A method for forming a device comprising:
providing a patterned reticle comprising a reticle perimeter which includes a target reticle perimeter defined by total length of circumference of active and dummy patterns, the dummy patterns comprise modified dummy structures, wherein a modified dummy structure includes one or more slots or voids therein and the one or more slots or voids are tailored to achieve the target reticle perimeter to produce a desired etch bias;
forming a resist layer on a substrate with a device layer;

exposing and developing the resist layer using the reticle to form a patterned resist layer containing active and dummy patterns of the reticle;

performing an etch to pattern the device layer using the patterned resist layer, wherein the patterned device layer includes active and dummy patterns of the reticle; and performing additional processing to complete forming the device.

2. The method of claim 1 wherein the reticle comprises a device region and a frame region surrounding the device region.

3. The method of claim 2 wherein the frame region separates adjacent devices and comprises dicing channels.

4. The method of claim 2 wherein:
the dummy patterns are disposed within the device and frame regions, and
the active patterns are disposed within the device region.

5. The method of claim 1 wherein the modified dummy structures with one or more slots or voids define a reticle perimeter value.

6. The method of claim 5 wherein the reticle perimeter value correlates to an etch bias.

7. The method of claim 1 wherein the exposing and developing the resist layer comprises a transmission rate.

8. The method of claim 7 wherein the modified dummy structures with one or more slots or voids define a transmission rate value.

9. The method of claim 8 wherein the transmission rate value correlates to an etch bias.

10. The method of claim 1 wherein the dummy structures are modified by modifying dummy pattern shape and space of the one or more slots or voids to achieve the target reticle perimeter to produce the desired etch bias.

11. The method of claim 1 wherein the modified dummy structures comprise solid and non-solid dummy structures.

12. The method of claim 11 wherein the non-solid dummy structures correspond to the slots or voids and the slots are filled with dielectric material to form dielectric slots.

13. The method of claim 12 wherein the dielectric slots are of the same size and disposed uniformly across the dummy structure.

14. The method of claim 12 wherein the dielectric slots have different sizes and are disposed within a non-solid region of the dummy structure.

15. The method of claim 1 wherein the dummy structures are modified to achieve the target reticle perimeter which narrows an etch bias range across a plurality of devices.

16. The method of claim 1 wherein providing the patterned reticle comprises providing a set of reticles used in forming the device, wherein the reticles of the set of reticles include the target reticle perimeter to produce the desired etch bias.

17. The method of claim 1 wherein providing the patterned reticle comprises providing sets of reticles for forming different devices, wherein reticles of the sets of reticles include the target reticle perimeter to produce the desired etch bias.

18. The method of claim 1 wherein size of the slots or voids in the modified dummy structure is tailored to achieve the target reticle perimeter.

19. The method of claim 1 wherein number of slots or voids in the modified dummy structure is tailored to achieve the target reticle perimeter.

20. The method of claim 1 wherein the modified dummy structure includes a plurality of slots or voids with different sizes which are tailored to achieve the target reticle perimeter.

21. The method of claim 1 wherein the modified dummy structures are tailored to achieve the desired etch bias according to a density equation.

22. A method for forming a device comprising:
providing a patterned reticle comprising a reticle perimeter which includes a target reticle perimeter defined by total length of circumference of active and dummy patterns, wherein
the active patterns are disposed in a device region and the dummy patterns are disposed in the device region and a frame region, the frame region surrounds the device region,
the dummy patterns comprise modified dummy structures, and
a modified dummy structure includes one or more slots or voids therein and the one or more slots or voids are tailored to achieve the target reticle perimeter to produce a desired etch bias;

forming a resist layer on a substrate with a device layer;

patterning the resist layer using the reticle to form a patterned resist layer containing active and dummy patterns of the reticle;

performing an etch to pattern the device layer using the patterned resist layer, wherein the patterned device layer includes active and dummy patterns of the reticle; and performing additional processing to complete forming the device.

23. The method of claim 22 wherein the modified dummy structure with one or more slots or voids defines a reticle perimeter value.

24. The method of claim 22 wherein the modified dummy structure with one or more slots or voids defines a reticle transmission rate value.

25. The method of claim 22 wherein:
the modified dummy structures comprise solid and non-solid dummy structures, and
the non-solid dummy structures correspond to the slots or voids and the slots are filled with dielectric material to form dielectric slots.

26. A device comprising:
a patterned mask comprising a reticle perimeter which includes a target reticle perimeter defined by total length of circumference of active and dummy patterns, wherein the active patterns are disposed in a device region and the dummy patterns are disposed in the device region and a frame region, the frame region surrounds the device region, the reticle perimeter correlates to an etch bias, wherein
the dummy patterns comprise modified dummy structures, wherein a modified dummy structure includes one or more slots or voids therein and the one or more slots or voids are tailored to achieve the target reticle perimeter, and
the modified dummy structures with one or more slots or voids define a pattern perimeter value.

* * * * *